United States Patent [19]
Spencer

[11] 4,316,187
[45] Feb. 16, 1982

[54] CURRENT RATING VERIFICATION SYSTEM

[76] Inventor: George A. Spencer, Rte. 2, Box 158-B8, Plano, Tex. 75074

[21] Appl. No.: 223,748

[22] Filed: Jan. 9, 1981

[51] Int. Cl.³ ...................... G08B 21/00; G01R 27/02
[52] U.S. Cl. ...................................... 340/664; 324/62
[58] Field of Search ............ 340/664; 324/62, 158 R, 324/58

[56] References Cited

U.S. PATENT DOCUMENTS

| | | | |
|---|---|---|---|
| 2,659,862 | 11/1953 | Branson | 324/64 |
| 2,976,486 | 3/1961 | Gilbert | 324/64 X |
| 3,277,364 | 10/1966 | Abrahamson | 324/64 X |
| 3,646,436 | 2/1972 | Chan et al. | 324/64 |
| 3,927,368 | 12/1975 | Zielonko et al. | 324/62 X |
| 4,092,591 | 5/1978 | Lozowski | 324/62 X |
| 4,156,181 | 5/1979 | Teass, Jr. | 324/62 |
| 4,278,932 | 7/1981 | Tait | 324/62X |

Primary Examiner—John W. Caldwell, Sr.
Assistant Examiner—Daniel Myer
Attorney, Agent, or Firm—Dennis T. Griggs

[57] ABSTRACT

Method and apparatus for verifying the load rating of an active alternating current distribution circuit at a power outlet. The load rating of the distribution circuit is verified by measuring the change in line voltage at the power outlet as different loads are applied. The no-load line voltage is factored out by summing an analog signal derived from the no-load line voltage with a reference voltage to produce a null balance. When the distribution circuit is loaded by a programmed load or by the load of an external appliance such as a resistance heater, the loaded circuit waveform is transformed and rectified to produce a relatively low amplitude no-load direct current waveform. The transformed, loaded circuit waveform and the null balance waveform are summed, amplified and measured. The amplified sum corresponds exactly with the drop in line voltage across the distribution circuit at the power outlet. The value of the measured change is then compared with the specifications of the National Electrical Code to determine the electrical quality of the distribution circuit. Because this value is independent with respect to wire size, wire type or load current, the tester can be used to set an external flag indicating that the voltage drop is greater than the code limit.

13 Claims, 2 Drawing Figures

CURRENT RATING VERIFICATION SYSTEM

BACKGROUND OF THE INVENTION

1. Field of the Invention

This invention relates generally to electrical test equipment, and in particular, to a method and tester apparatus for verifying the load rating of an active alternating current distribution circuit.

2. Description of the Prior Art

Adequate wiring for an alternating current power distribution circuit is a function of several design considerations which involve the current capacities of conductors. Wire size is the primary factor in establishing current capacity, but the type of conductor insulation material, the proximity of other conductors, enclosure of the conductors in conduits, raceways, or thermal insulation, and ambient temperature are factors that also determine the current capacity of conductors. The National Electrical Code specifies the allowable current capacities of conductors for the various standard wire sizes as influenced by the foregoing factors.

When a power distribution circuit is designed, a wire size is selected which will carry the maximum rated current for the expected service, with a voltage drop not to exceed the amount specified by the National Electrical Code. The National Electrical Code sets guidelines to establish the maximum voltage drop allowed for a loaded circuit. It permits a two percent drop in a main feeder and a three percent drop in any branch. This maximum allowable drop is five percent for any feeder/branch combination. These guidelines are provided to prevent overheating of the wiring and to avoid damage to appliances when operated at a marginal voltage level.

Wire size, insulation condition and interconnection resistance are the main factors which contribute to excessive voltage drops in power distribution circuits. According to conventional testing procedures, a new distribution circuit is normally checked with a volt meter. Because a volt meter does not load the distribution circuit, faulty material or poor connections are not revealed. The volt meter tests only confirm that the proper connections have been made.

Even assuming that a power distribution circuit has been installed correctly, it can be damaged by excessive load conditions. An example of this is the effect of lightning striking an ungrounded T.V. antenna. Even with the T.V. turned off, the induced electric current from the lightning will pass through the T.V. set via the common conductor to the fuse box or main feeder where the common is grounded and not protected by a fuse. The on/off switch on the T.V. set disconnects only the conductor which is connected to the fuse.

Because the induced current does not pass through the fuse or circuit breaker at the fuse box, there will be no indication that an overload has occured. It is possible that the induced current may be so high that it can blister or otherwise damage the insulation around the wire. Even if the insulation is not damaged, the induced current may be high enough to alter the electrical conductivity of the wire. This type of damage appears as a sharp increase in the electrical resistance in the neutral conductor. The increase in resistance is often concentrated in small areas, forming hot spots.

Because the resistance of power conductors increases with temperature, there is a possibility that thermal runaway may occur, and set the surrounding structure on fire. Thermal runaway is an effect associated with conductors having a positive coefficient of resistance change with temperature, with a rise in temperature causing an increase in resistance which in turn causes an additional rise in temperature. When this occurs in electrical wiring, the thermal runaway will continue until the line protector trips, or the wire becomes red hot, thereby causing a fire.

Aging of the conductor also contributes to the risk of thermal runaway. As an electrical conductor ages, it takes on the electrical characteristics of a conductor which has had an excessive load applied to it, and therefore is subject to thermal runaway. The aging effect occurs at different rates for copper and aluminum power conductors. The rate that aluminum ages to exhibit a higher resistance is substantially greater than the rate at which copper ages.

The danger of thermal runaway is increased by the retrofitting of existing dwellings with thermal insulation. Any aged or overfused circuits that are covered by new insulation become confined in a thermal blanket. Under the confined conditions, the restricted heat builds up more quickly and thermal runaway happens much earlier.

Overfusing or installation of oversized circuit breakers can also bring about circuit overload which may lead to thermal runaway. An oversized fuse or breaker is often installed when the correct fuse is not available or when the original fuse repeatedly trips. Overrating may also occur from a defective breaker which will not trip. This situation is particularly dangerous since it is generally assumed (incorrectly) that an electrical circuit can be safely loaded until the circuit protector trips.

Interconnection resistance caused by defective connections also contributes to electrical wiring fires. Poor connections are usually found at wire nuts, barrier strip junctions, receptacle connections and fuse box connections. Other sources of poor connections are bad internal contacts of a circuit breaker or switch. The problem of interconnection resistance is aggravated by the use of aluminum wiring. Aluminum wiring is subject to accelerated damage from overloads, poor connections and physical damage because of the electrolysis of junctions induced by dissimilar metal reaction. Moreover, thermal expansion and contraction cause the connections to become loose. As the connections become loose, the contact resistance increases due to the reduced pressure.

It will be recognized that all wiring deteriorates and wears out in time due to the effects of current flow, switching and corrosion. Although aluminum wiring is much more likely to cause an electrical fire, copper wiring also ages and deteriorates. The useful life of any distribution circuit depends on the insulation method, its frequency of usage and the current levels to which it is subjected.

Because fuse overrating and aged wiring are common in a number of residential neighborhoods and office buildings, the only sure way to determine if an electrical fire hazard is developing in the hidden wall areas of the buildings is to test the distribution circuits at the power outlets under actual or programmed load conditions.

The terminal voltage in most private dwellings and office buildings is 120 volts RMS. The maximum allowable voltage drop from the utility power transformer to the wall outlet is five percent of RMS terminal voltage, or six volts. A deflection of six volts in a voltmeter having a full scale deflection of 150 volts represents a change of approximately four percent of full scale. Such a change in that scale range is too small to be reliably detected and accurately measured by visual inspection on most voltmeters.

There is, therefore, a serious and urgent need for a tester which can verify the load rating of an active alternating current distribution circuit in which voltage drop at the power outlet can be measured accurately and reliably by loading the distribution circuit with an actual resistance load of an appliance, or by a programmed load.

OBJECTS OF THE INVENTION

It is, therefore, an object of the invention to provide a method and apparatus for verifying the load rating of an active alternating current distribution circuit at a power outlet in which the change in line voltage between no-load current conditions and programmed load current conditions is accurately and reliably indicated.

Another object of this invention is to provide method and apparatus for detecting defects in power distribution wiring and connections which cause a voltage drop, including undersized wire, aged wire and defective connections at receptacles, splices and fuse boxes.

A related object of the invention is to provide a tester which can be used to verify the current using rate of an appliance.

Yet another object of the invention is to provide a tester which can be used to determine the safety margin between an appliance and an outlet.

SUMMARY OF THE INVENTION

The load rating of an active alternating current distribution circuit is determined by measuring the change in line drop voltage as different loads are applied. The effect of the no-load line voltage is factored out by summing an adjustable reference voltage with the no-load voltage and then adjusting the reference voltage for a null balance or zero sum indication. Thereafter, a change in the line voltage is measured and displayed on a digital volt meter.

According to a preferred embodiment, the no-load alternating current waveform delivered by the power distribution circuit at a power outlet station is transformed to yield a no-load alternating current waveform at a substantially reduced amplitude. This reduced amplitude waveform is rectified to yield a no-load direct current waveform. The no-load direct current waveform is summed with a direct current reference waveform having the opposite polarity. The amplitude of the direct current reference waveform is adjusted to a null balance voltage level until the measured sum is zero.

To determine the magnitude of the voltage drop along the distribution circuit, a known resistance load is connected across the distribution circuit at the power outlet. The amplitude of the loaded circuit alternating current waveform is reduced by a step-down transformer. The loaded circuit waveform is then rectified to produce a loaded circuit DC voltage. The loaded circuit DC voltage and the previously established null balance voltage are then summed together, with the sum directly indicating the magnitude of the voltage drop along the distribution circuit for agiven load condition.

The loaded and no-load waveforms are transformed through a step-down transformer to substantially lower levels to be compatible with the relatively low power voltage operating levels of conventional logic devices, for example operational amplifiers which require plus and minus fifteen volt supplies. The true magnitude of the voltage fluctuation induced by circuit loading is preserved by amplifying the sum of the loaded circuit direct current reference waveform and the null balance waveform by an amplifier having a gain which is substantially equal to the transformer primary-to-secondary step-down ratio.

The novel features which characterize the invention are defined by the appended claims. The foregoing and other objects, advantages and features of the invention will hereinafter appear, and for purposes of illustration of the invention, but not of limitation, an examplary embodiment of the invention is shown in the appended drawings.

DETAILED DESCRIPTION OF A PREFERRED EMBODIMENT

Figure 1:
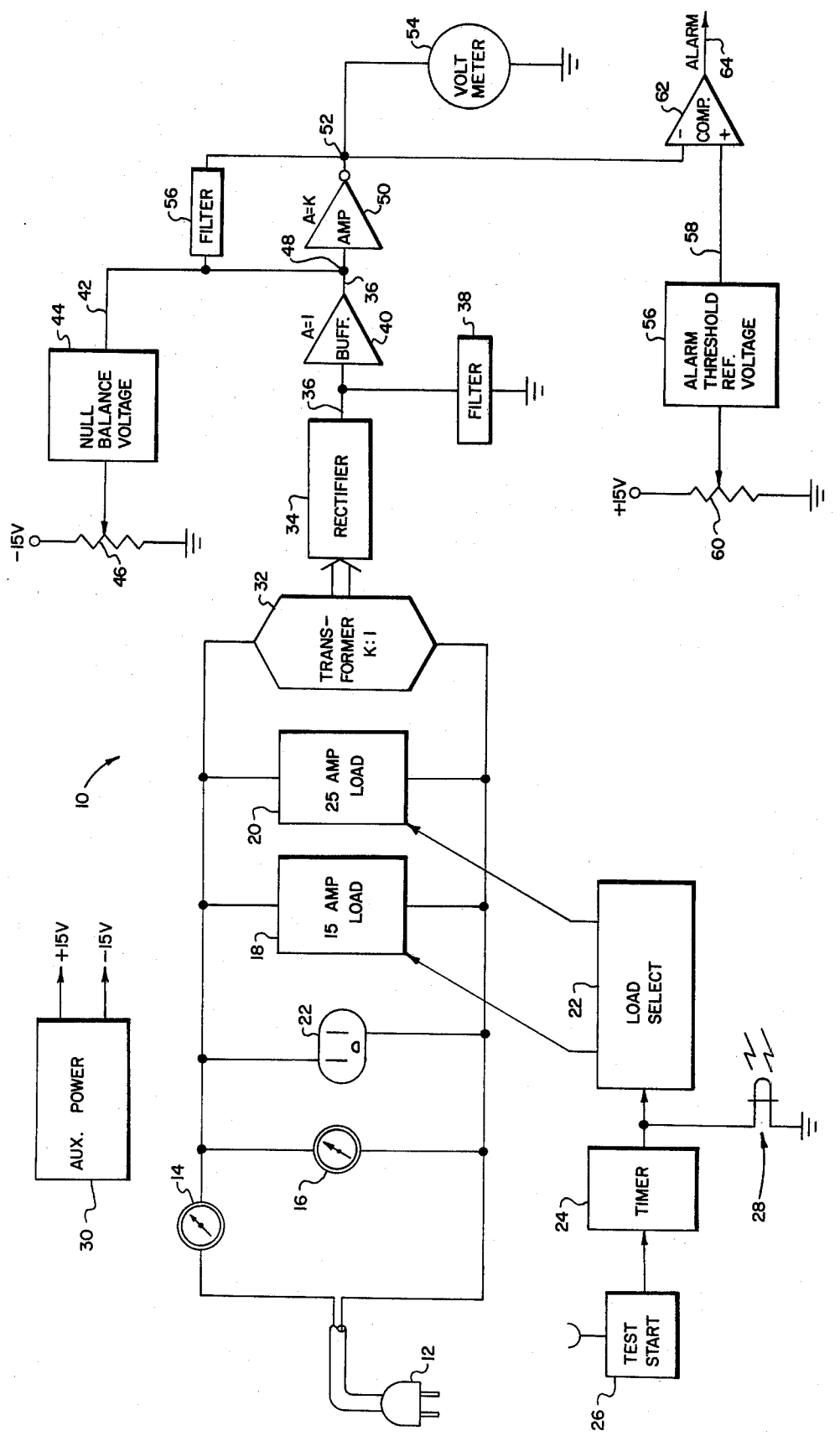
FIG. 1 is a general block diagram of a current rating verification system according to the present invention; and, FIG. 2 is a schematic circuit diagram which corresponds with the block diagram of FIG. 1.

In the description which follows, like parts are marked throughout the specification and drawings with the same reference numerals, respectively.

Referring now to FIG. 1, a current rating verification tester assembly 10 may be used as a portable inspection instrument or as a permanent monitor installed in a single or multi-family dwelling or office. The tester assembly 10 indicates the electrical quality of a distribution circuit by measuring the change in line voltage as different loads are applied. The operating principles of the tester assembly 10, when used as a portable inspection instrument, are the same as when it is used in a permanent monitor installation.

The tester assembly 10 shown in FIG. 1 is provided with a conventional power plug 12 for insertion into the wall outlet receptacle of a power distribution outlet. It should be understood, however, that the tester assembly 10 may be applied across a power distribution circuit at any outlet point or station, or it may be hard wired across a power distribution circuit in a permanent monitor installation.

The tester assembly 10 is provided with an AC current meter 14 and an AC voltage meter 16 for verifying the current and voltage delivered by the distribution circuit under test. These two meters are operational at all times while the tester is being loaded by internal programmed loads 18, 20 or by an external appliance plugged into the tester's AC receptacle 22.

The two loads 18, 20 of the internal loading circuit comprises a fifteen amp load and a twenty-five amp load. Each load preferably is a length of nichrome resistance wire calculated to draw fifteen amps and twenty-five amps, respectively, for an outlet voltage of 120 volts RMS. The desired load is electrically connected across the power plus 12 by a load select circuit 22. The loads may be engaged separately, or in combination to yield a 40 amp load.

A timer circuit 24, which is initiated by a start test switch 26, safely limits the maximum time that either one or both of the loads are engaged during testing, for example three seconds. A lamp 28 provides a visual indication and confirmation that a selected load is being energized.

The logic circuitry of the tester assembly 10 includes solid state electronic components which operate at relatively low DC voltage levels. The low voltage operating power is provided by an auxillary power circuit 30 which develops plus fifteen volts and minus fifteen volts from the distribution line voltage.

The current rating of the distribution circuit is verified by measuring the change in line drop voltage as different loads are applied across the outlet terminal. Typically, the line voltage will drop by only a few volts in the range of 3 to 10 volts. A voltage change of three to ten volts from a nominal voltage of 120 volts RMS on a voltmeter having a full scale deflection of 150 volts, for example, cannot be accurately determined by visual inspection on most commonly available voltmeters, in part because of the lack of adequate scale resolution in that range. Accurate measurement of the line drop differential is provided in the present invention by generating a reference voltage which is equal in magnitude but opposite in polarity to an analog DC reference voltage which is derived the no-load terminal voltage which is delivered by the distribution circuit at the outlet. The reference voltage is adjustable to produce a null balance condition with the no-load reference voltage. However, this reference voltage may also be automatically derived from the main power distribution system.

After the tester assembly 10 has been balanced to the null condition, the power distribution circuit is loaded by the connection of a programmed load, for example the fifteen amp load 18 or the twenty-five amp load 20, with the result that the terminal voltage at the power distribution outlet will decrease because of the voltage drop induced by the resistance of the feeder and distribution circuit between the utility transformer and the power distribution outlet. A decrease in the terminal voltage induces a decrease in the analog DC signal representative of the terminal voltage at the outlet. Because the polarity of the analog line voltage and of the null balance voltage are opposite, the sum of the null balance voltage and of the analog line voltage is directly proportional to the actual voltage drop at the outlet terminal. The sum of the analog terminal voltage and of the null balance reference voltage is amplified by a suitable factor to yield the exact magnitude of the terminal voltage drop at the distribution outlet.

Referring again to FIG. 1, after the tester assembly 10 has been plugged into the distribution outlet, it is necessary to balance the tester assembly 10 with respect to the no-load line voltage which appears across the distribution outlet. This balancing procedure is preferably carried out by logic components which operate at relatively low direct current voltage levels. Accordingly, the no-load line voltage is transformed to a lower amplitude by a step-down transformer 32 having a primary-to-secondary turns ratio of K equal to 11.6. The DC analog signal is then developed by converting the step-down no-load AC voltage to a DC voltage in a rectifier circuit 34. The DC analog voltage 36 appearing at the output of the rectifier 34 is then smoothed by a filter circuit 38 to suppress noise and ripple components. The filtered, DC analog voltage 36 is coupled to a summing resistor R1 through a buffer amplifier 40. The purpose of the buffer amplifier 40 is to provide interstage load isolation between the rectifier 34, filter 38 and the summing circuit.

A negative polarity null balance voltage signal 42 is developed by a voltage divider circuit 44 which includes an adjustable resistor 46 which is coupled to the minus fifteen volt output of the auxillary power supply 30. The null balance voltage signal 42 is summed through a summing resistor R2 with the DC analog signal 36 at a node 48 which forms an input to an operational amplifier 50. The variable resistor 46 is adjusted until the null balance voltage signal 42 exactly equals the DC analog signal 36 whereby the output node 52 of the operational amplifier 50 is zero as indicated by a digital voltmeter 54 which is connected across the output node.

Connected in parallel with the operational amplifier 50 is a ripple filter 56 which suppresses transients and ripple components in the DC analog signal which might interfere with operation of the digital voltmeter. Moreover, the ripple filter prevents rapid ramping of the voltmeter and gives a division effect for noise spikes.

In certain installations, for example when the tester assembly 10 is permanently wired to the distribution circuit, it is desirable to provide an audible or a visual alarm in response to a circuit overload condition. Accordingly, an alarm threshold reference voltage circuit 56 generates an alarm reference voltage 58 which is adjustable through a range which includes a threshold value corresponding with a failure condition such as a circuit overload. The amplitude is adjustable through a variable resistor 60 which is connected to the positive fifteen volt output of the auxillary power circuit 30. The voltage signal represented by the sum of the null balance voltage signal and the DC analog signal is compared with the alarm reference voltage by a comparator 62. The comparator conducts an alarm signal 64 in response to an excursion of the amplified sum across the preset alarm threshold value.

Figure 2:
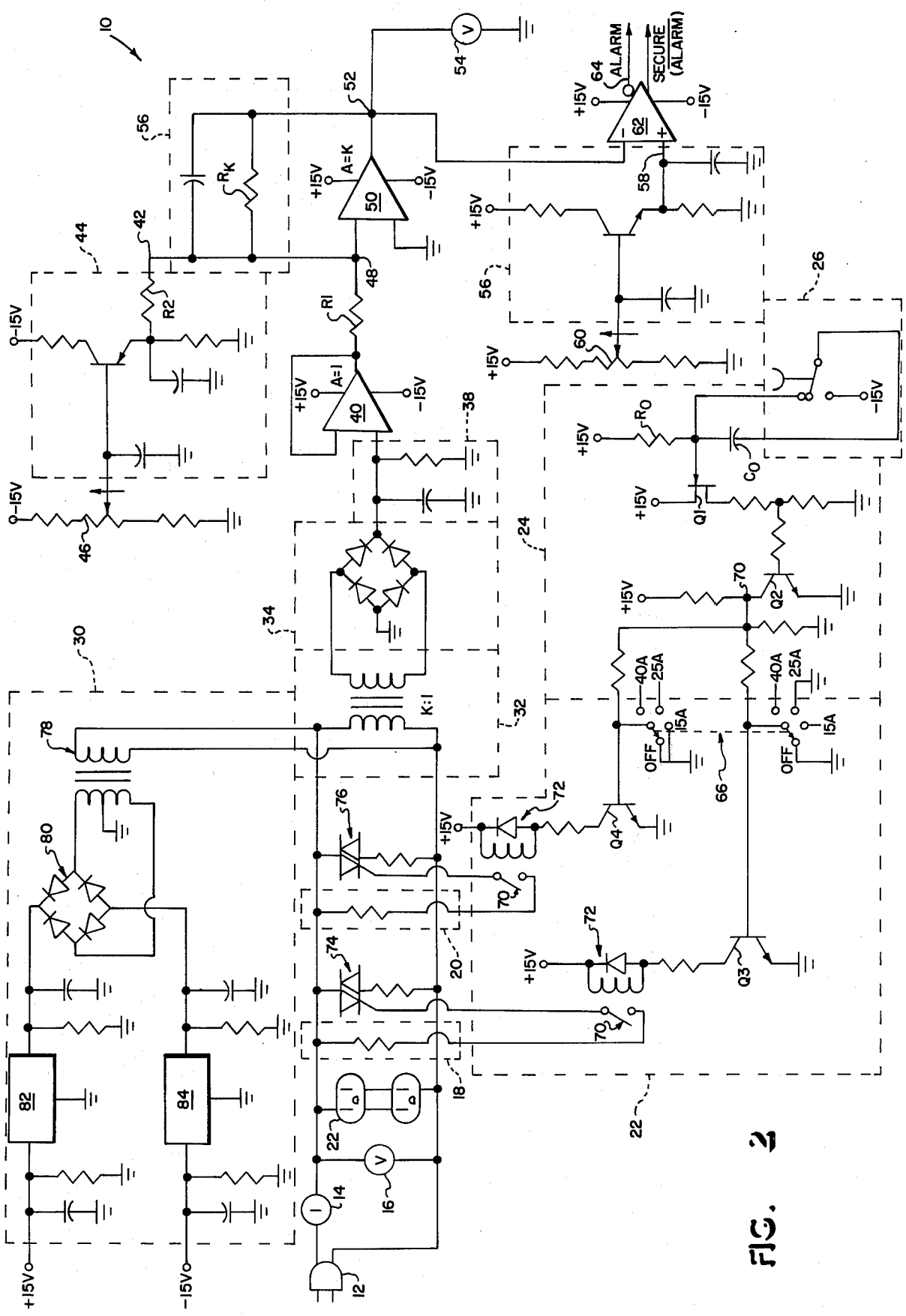

Referring now to FIG. 2, operation of the tester assembly 10 will be described with reference to a selected internal load.

After the tester assembly has been plugged into an outlet terminal, the test current is selected by rotating the ganged switch assembly 66 from the OFF position to one of the three load positions, for example the first position which corresponds with the fifteen amp load. At this point, it should be verified that the voltmeter 16 reads approximately 120 volts, and that the current meter 14 reads approximately zero amps. Next, the variable resistor 46 is adjusted to produce a zero display in the digital voltmeter 54. The tester assembly 10 is now ready to test the distribution circuit under load.

When the test start switch 26 is depressed it applies minus fifteen volts to the negative side of a charging capacitor 68. The capacitor 68 acts as an instant short and transfers the minus fifteen volts to the gate of a field effect transistor Q1. A negative voltage on the gate of the field effect transistor Q1 causes it to be turned off. This causes the base of the transistor Q2 to be grounded, thereby turning it off. With Q2 turned off, the node 70 assumes a voltage level of approximately 1.6 volts. Assuming that the fifteen amp load is selected, the base of transistor Q3 is ungrounded, and its base emitter junction is forward biased. At the same time, the switch selector 66 maintains the base of transistor Q4 grounded at zero volts, thereby cutting off this transistor and disabling the relay 72 for the twenty-five amp load 20. With Q3 forward biased by a base drive of approximately one milliamp, its collector current will be sufficient to energize the relay solenoid and close the switching contacts 70 of a relay 72. The closing of the switch contact 70 cause a triac 74 to conduct, thereby applying the nichrome load resistor 18 (7.67 ohms) across the distribution outlet, with the result that a fifteen amp current load is conducted through the distribution circuit.

The foregoing load will be applied for only a few seconds because of the limiting action of the timer circuit 24. If the test switch 26 is released prior to the limit time of the timer circuit 24, the gate voltage of the field effect transistor Q1 will be returned to a positive fifteen volts, thereby turning it on and clamping its collector to approximately zero volts. This grounding action insures that both transistors Q2 and Q3 are both cut-off, thereby disabling the triacs 74, 76.

Assuming that the test switch is held for three seconds or more, the time constant $R_oC_o$ of the timing resistor $R_o$ and the capacitor $C_o$ charge the gate input of the field effect transistor Q1 until it reaches a positive turn-on voltage level. This time delay is typically three to four seconds, depending upon the values of the charging resistor and capacitor and the threshold turn-on voltage of Q1.

Prior to depressing the test switch 26, the step-down transformer 32, having a primary-to-secondary turns ratio K=11.6:1, will transform the no-load terminal voltage of 120 volts to 10.345 volts. Accordingly, the null balance voltage signal should be adjusted to equal minus 10.345 volts to cancel the plus 10.345 volts from the non-inverting buffer amplifier 40. When the null balance voltage level 42 is adjusted properly, the output voltage read by the digital voltmeter 54 will indicate zero. The gain A is adjusted to equal the turns ratio K of the primary winding to the secondary winding of the transformer 32. This is accomplished by selecting the resistor $R_k$ in the filter 56 to be an integral multiple of the turns ratio K. In this case, the resistor $R_k$ is equal to 11.6K ohms, because the step-down ratio of the primary to the secondary winding in transformer 32 is 11.6.

By depressing the test switch 26, the fifteen amp load is applied across the distribution outlet. For purposes of illustration, it is assumed that there is one-third of an ohm resistance between the distribution outlet and the fuse box. It is also assumed that the no-load line voltage at the distribution outlet was 120 volts. The fifteen amp load and the one-third ohm resistance will produce a drop in the line voltage at the distribution outlet of five volts, with the outlet voltage reading, under load, 115 volts. The change on the primary of the transformer 32 from 120 volts to 115 volts causes the output of the non-inverting buffer amplifier 40 to change from 10.345 volts to 9.914 volts, which is a decrease of 0.431 volts. This 0.431 volts is multiplied in the operational amplifier 50 by a factor of 11.6, thereby giving an output indication of 5 volts.

The DC analog signal 36 and the null balance voltage signal 42 are summed through summing resistors R1 and R2 at the summing node 48.

The threshold reference voltage circuit 56 is a voltage regulator which sets the trip voltage on one input of the comparator 62. As the alarm reference voltage is positive and is being applied to the positive input of the comparator 62, the negative input of the comparator 62 from the operational amplifier 50 must be positive with respect to the alarm reference voltage to cause the alarm signal 64 to be generated.

The auxillary power circuit 30 includes a transformer 78 and rectifier assembly 80 which supplies a positive and negative voltage to positive and negative voltage regulators 82, 84, respectively, which provide a fixed output of plus 15 volts and minus 15 volts, respectively.

When testing the safety of an external appliance, for example a resistance heater, the tester assembly 10 is first adjusted to the null balance condition for no-load voltage. After the null balance condition has been established, the appliance to be tested is plugged into the tester's external receptacle 22. When the appliance is turned on, the tester assembly 10 will react in the same manner as if the test start switch had been depressed. The current meter 14 will indicate the amount of current the appliance is using, and the digital volt meter 54 will indicate the drop in line voltage, which is an indication of the safety of that appliance for use in combination with that particular wall outlet and distribution circuit.

When used as a portable inspection instrument, the tester assembly 10 can quickly and easily apply a programmed current load to the outlet terminal of a distribution circuit. Actual load current as well as display line voltage before and during the tests are also indicated. The voltage differential between the no-load current and the programmed load current is displayed, preferably by a digital voltmeter, or by a conventional voltmeter having an appropriate scale for the expected voltage differential range. Additionally, when an external appliance is plugged into the tester assembly, the current meter 14 can be used to measure the actual current usage of the appliance. The tester can also be used to verify the suitability of a distribution circuit for supplying power to the actual appliance, and will give an immediate indication if the voltage drop is unacceptable. An internal or external alarm is driven by an alarm circuit when failure is detected.

For a permanent monitor installation, the tester assembly 10 can be used to display line voltage, for displaying the differential voltage to indicate no use or use of outlets in each branch and phase of the distribution circuit. The tester assembly can also set an internal or external alarm if any branch circuit has an electrical load applied which exceeds the capability of the distribution conductors and connections. In a fault isolation mode, the tester assembly can test the current rating and load quality of appliances. Moreover, the tester assembly provides a constantly updated indication of the condition of the distribution wiring.

Although a preferred embodiment of the invention has been described in detail, it should be understood that various changes, substitutions and alterations can be made therein without departing from the spirit and scope of the invention as defined by the appended claims.

What is claimed is:

1. A method for verifying the load rating of an active alternating current distribution circuit at a power outlet comprising the steps:

generating a direct current analog waveform proportional to the amplitude of the no-load line voltage delivered by the power distribution circuit at the power outlet;

summing the no-load direct current analog waveform with a direct current reference waveform having the opposite polarity;

adjusting the amplitude of the direct current reference waveform to a null balance level until said sum is zero;

connecting a resistance load across the distribution circuit at the power outlet station;

generating a direct current analog waveform proportional to the amplitude of the loaded circuit line voltage delivered by the power distribution circuit at the power outlet; and, measuring the sum of the loaded circuit direct current analog waveform and the null balance waveform.

2. A method for verifying the load rating of an active alternating current distribution circuit at a power outlet as defined in claim 1, said no-load analog waveform generating step comprising:

transforming the no-load alternating current waveform delivered by the power distribution circuit at the power outlet to yield a no-load alternating current waveform having a substantially reduced amplitude; and, rectifying the reduced amplitude alternating current waveform to yield a no-load direct current waveform.

3. The method as defined in claim 2 including the step of:

amplifying the amplitude of the waveform sum by a factor which is substantially equal to the transforming ratio.

4. A method for verifying the load rating of an active alternating current distribution circuit at a power outlet as defined in claim 1, said loaded circuit analog waveform generating step comprising:

transforming the loaded circuit, alternating current waveform delivered by the power distribution circuit at the power outlet station to yield a loaded circuit, alternating current waveform having a substantially reduced amplitude; and, rectifying the reduced amplitude, loaded circuit alternating current waveform to yield a loaded circuit direct current waveform.

5. The method as defined in claim 1 including the step of:

limiting the duration that the resistance load is connected across the distribution circuit.

6. The method as defined in claim 1 including the step of:

adjusting the amplitude of an alarm reference signal to equal a threshold value corresponding with a failure condition; and, comparing the amplitude of the waveform sum with the amplitude of the direct current alarm reference signal.

7. A tester for verifying the load rating of an active electrical power distribution circuit at a power outlet comprising, in combination:

means for generating a direct current analog waveform proportional to the amplitude of the line voltage delivered by the power distribution circuit at the power outlet;

a reference generator for producing an adjustable amplitude, direct current reference waveform having a polarity opposite to the polarity of the direct current waveform;

an adding circuit having a first input coupled to the rectifier circuit for receiving the direct current analog waveform and a second input coupled to the reference generator for receiving the opposite polarity reference waveform, and having an output for conducting the sum of those waveforms;

an amplifier having an input coupled to the output of said adding circuit for receiving and amplifying the sum of said waveforms;

detector means coupled to said amplifier for registering the amplified sum;

a resistance load; and, switching means coupled to the auxillary resistance load for disconnecting said load from said distribution circuit during a no-load balancing operation, and for connecting said load across the distribution circuit at the power outlet station during a load testing operation.

8. The tester as defined in claim 7, said analog waveform generating means including:

a step-down transformer having a primary winding for connection to the power distribution circuit at the power outlet and having a secondary winding coupled to the primary winding for transforming the alternating current waveform delivered by the power distribution circuit at the power outlet to yield an alternating current waveform having a substantially reduced amplitude; and, a rectifier circuit coupled to the transformer secondary winding for converting the reduced amplitude alternating current waveform to yield a direct current waveform.

9. The tester as defined in claim 8, the gain of said amplifier being substantially equal to the transformer step-down ratio.

10. The tester as defined in claim 7, said detector means comprising a voltage meter.

11. The tester as defined in claim 7, said detector means comprising:

an alarm reference signal generator having a direct current output, the amplitude of which is adjustable through a range which includes a threshold value corresponding with a failure condition; and, a comparator having first and second inputs coupled to said amplifier and to the alarm reference generator for receiving the amplified sum and alarm reference signals, respectively, and having an output for conducting an alarm signal in response to an excursion of said amplified sum across the threshold value.

12. The tester as defined in claim 7, said switching means including an AC power receptacle coupled to the primary winding of said transformer; and, said resistance load being an external appliance having a plug for engaging said AC power receptacle.

13. The tester as defined in claim 7, said resistance load comprising a plurality of resistance wires, each resistance wire having a resistance which is calculated to draw a predetermined current at the line voltage of the distribution circuit.

* * * * *